(12) United States Patent
Parkhe

(10) Patent No.: US 12,493,303 B2
(45) Date of Patent: Dec. 9, 2025

(54) INCREASING THE GAS EFFICIENCY FOR AN ELECTROSTATIC CHUCK

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/220,705

(22) Filed: Jul. 11, 2023

(65) Prior Publication Data

US 2023/0350435 A1    Nov. 2, 2023

Related U.S. Application Data

(62) Division of application No. 15/667,708, filed on Aug. 3, 2017, now Pat. No. 11,747,834, which is a division of application No. 14/529,985, filed on Oct. 31, 2014, now Pat. No. 9,753,463.

(60) Provisional application No. 62/049,963, filed on Sep. 12, 2014.

(51) Int. Cl.
    G05D 7/06      (2006.01)
    H01J 37/32     (2006.01)
    H01L 21/67     (2006.01)
    H01L 21/683    (2006.01)

(52) U.S. Cl.
CPC ........ G05D 7/0623 (2013.01); H01J 37/3244 (2013.01); H01J 37/32449 (2013.01); H01J 37/32724 (2013.01); H01L 21/67109 (2013.01); H01L 21/6831 (2013.01); H01L 21/6833 (2013.01); *Y10T 29/49771* (2015.01); *Y10T 29/49776* (2015.01)

(58) Field of Classification Search
CPC ................ G05D 7/0623; H01J 37/3244; H01J 37/32449; H01J 37/32724; H01L 21/67109; H01L 21/6831; H01L 21/6833; Y10T 29/49771; Y10T 29/49776
See application file for complete search history.

(56) References Cited

U.S. PATENT DOCUMENTS

| | | | |
|---|---|---|---|
| 4,818,359 A * | 4/1989 | Jones | ...................... C23C 14/34 204/192.12 |
| 5,748,435 A | 5/1998 | Parkhe | |
| 6,179,921 B1 | 1/2001 | Ruffell et al. | |

(Continued)

FOREIGN PATENT DOCUMENTS

| | | |
|---|---|---|
| CN | 101471279 A | 7/2009 |
| CN | 101903996 A | 12/2010 |

(Continued)

OTHER PUBLICATIONS

International Search Report and Written Opinion for PCT/US2015/044102, dated Nov. 19, 2015, 14 pgs.

(Continued)

*Primary Examiner* — Charlee J. C. Bennett
(74) *Attorney, Agent, or Firm* — Schwabe, Williamson & Wyatt, P.C.

(57) ABSTRACT

A gas is received through an inlet. A portion of the gas is supplied to an electrostatic chuck. A portion of the gas is re-circulated through a compressor. A pressure of the second portion of the gas is increased. The second portion of the gas is stored in a gas storage.

4 Claims, 10 Drawing Sheets

(56) References Cited

U.S. PATENT DOCUMENTS

| | | | |
|---|---|---|---|
| 6,217,633 B1* | 4/2001 | Ohmi | C23C 16/4412 96/111 |
| 8,316,867 B2 | 11/2012 | Jennings et al. | |
| 8,337,660 B2 | 12/2012 | Buchberger, Jr. et al. | |
| 2002/0003037 A1* | 1/2002 | Cousineau | H01L 21/67248 165/206 |
| 2002/0073924 A1 | 6/2002 | Chiang et al. | |
| 2002/0094306 A1* | 7/2002 | Hara | G05D 16/2013 118/723 VE |
| 2004/0011463 A1* | 1/2004 | Nakagawa | H01L 21/67207 156/345.18 |
| 2004/0022694 A1 | 2/2004 | Hara et al. | |
| 2005/0045104 A1* | 3/2005 | Arai | H01L 21/67109 118/724 |
| 2005/0229955 A1* | 10/2005 | Desbiolles | C23C 16/45593 134/1.1 |
| 2006/0065189 A1* | 3/2006 | Babic | H01L 21/67034 134/10 |
| 2007/0030621 A1 | 2/2007 | Gaff et al. | |
| 2007/0081294 A1 | 4/2007 | Buchberger, Jr. et al. | |
| 2007/0081296 A1 | 4/2007 | Brillhart et al. | |
| 2007/0089834 A1 | 4/2007 | Brillhart et al. | |
| 2007/0091541 A1 | 4/2007 | Buchberger et al. | |
| 2008/0072929 A1* | 3/2008 | White | C23C 16/4412 118/723 R |
| 2009/0001524 A1 | 1/2009 | Siegele et al. | |
| 2011/0061812 A1 | 3/2011 | Ganguly et al. | |
| 2013/0252533 A1* | 9/2013 | Mauck | F24F 3/14 454/187 |
| 2016/0030926 A1* | 2/2016 | Noyes | B01J 37/0238 422/142 |

FOREIGN PATENT DOCUMENTS

| | | | | |
|---|---|---|---|---|
| CN | 103069560 | | 4/2013 | |
| JP | 2002/252271 | | 9/2002 | |
| JP | 2003/347283 | | 12/2003 | |
| JP | 2003347283 | A * | 12/2003 | |
| WO | WO 2006/044724 | | 4/2006 | |
| WO | WO 2013/096503 | | 6/2013 | |
| WO | WO 2014/151942 | | 9/2014 | |
| WO | WO-2014151942 | A1 * | 9/2014 | C01B 3/40 |

OTHER PUBLICATIONS

Non-Final Office Action from U.S. Appl. No. 14/529,985 mailed Mar. 22, 2017, 8 pgs.
International Preliminary Report on Patentability for PCT/US2015/044102 dated Mar. 23, 2017, 10 pgs.
Official Letter from the Taiwan Intellectual Property Office (TIPO) dated Nov. 21, 2018 for Taiwan Patent Application No. 104129167; 6 pgs.
Notice of First Office Action for Chinese Patent Application No. 201580043978.9, issued Jan. 28, 2019, 12 pgs.
First Office Action-Rejection Report from Japanese Patent Application No. 2017-505188 mailed Sep. 21, 2019, 5 pgs.
Non-Final Office Action from U.S. Appl. No. 15/667,708 dated Feb. 6, 2020, 19 pgs.
Final Office Action from U.S. Appl. No. 15/667,708 dated Jun. 9, 2020, 11 pgs.
Non-Final Office Action from U.S. Appl. No. 15/667,708 dated Jan. 22, 2021, 10 pgs.
Final Office Action from U.S. Appl. No. 15/667,708 dated May 21, 2021, 9 pgs.
Notice to File a Response from Korean Patent Application No. 10-2017-7002762 dated Aug. 23, 2021, 7 pgs.
Non-Final Office Action from U.S. Appl. No. 15/667,708 dated Nov. 4, 2021, 19 pgs.
Final Office Action from U.S. Appl. No. 15/667,708 dated Feb. 25, 2022, 12 pgs.
Non-Final Office Action from U.S. Appl. No. 15/667,708 dated Aug. 30, 2022, 10 pgs.
Final Office Action from U.S. Appl. No. 15/667,708 dated Jan. 30, 2023, 12 pgs.

* cited by examiner

INCREASING THE GAS EFFICIENCY FOR AN ELECTROSTATIC CHUCK

CROSS-REFERENCE TO RELATED APPLICATIONS

This application is a divisional of co-pending U.S. application Ser. No. 15/667,708 entitled "INCREASING THE GAS EFFICIENCY FOR AN ELECTROSTATIC CHUCK" FILED Aug. 3, 2017, which is a divisional of U.S. application Ser. No. 14/529,985 entitled "INCREASING THE GAS EFFICIENCY FOR AN ELECTROSTATIC CHUCK" filed Oct. 31, 2014, now U.S. Pat. No. 9,753,463 issued on Oct. 31, 2014, which claims the benefit of prior U.S. Provisional Patent Application No. 62/049,963, entitled "INCREASING THE GAS EFFICIENCY FOR AN ELECTROSTATIC CHUCK" filed on Sep. 12, 2014, which are hereby incorporated by reference in their entirety.

FIELD

Embodiments of the present invention pertain to the field of electronic device manufacturing, and in particular, to providing a gas to an electrostatic chuck.

BACKGROUND

Generally, in plasma processing systems photons, ions, and other plasma particles impinge on a wafer and heat the wafer up. For plasma processing, the wafer is placed on an electrostatic chuck in a processing chamber. Typically, a gas (e.g., helium) is used on the back side of the wafer to enhance heat transfer between E chuck and the wafer. To introduce the gas with less resistance, grooves are milled into the chuck. The gas entering the grooves on the chuck diffuses under the wafer and can leak beneath the wafer into the chamber.

Typically, only a minor portion of helium back side gas (e.g., at a flow rate of about 0.5 standard cubic centimeters per minute (SCCM) passes through the chuck due to good seal between the polished outer seal band on the chuck and the back side surface of the wafer. The major portion of the backside helium (at a flow rate of about 19.5 SCCM) is dumped through an orifice in a vacuum system. This is not an efficient way of using the back side expensive heat transfer gas.

Currently, due to government regulations and increased cost of helium, many manufacturers are using gases other than helium, such as nitrogen and argon as back side gases in electrostatic chucks. Nitrogen and argon have serious limitations in electrical ionization potential and thermal properties that can be unacceptable for some plasma tools.

Furthermore, argon and nitrogen back side gases at certain plasma conditions have conductive path and arcing issues. These issues lead to generation of defects (e.g., holes, marks, other defects) and damaging the wafer that significantly limits the plasma processing design and increases manufacturing cost.

SUMMARY

Methods and apparatuses to increase the efficiency of a gas for an electrostatic chuck (e-chuck) are described. A gas is received through an inlet. A first portion of the gas is supplied to an e-chuck. A second portion of the gas is re-circulated through a compressor.

In an embodiment, a gas is received through an inlet. A first portion of the gas is supplied to an e-chuck. A second portion of the gas is re-circulated through a compressor. A pressure of the second portion of the gas is increased by the compressor. The second portion of the gas is stored in a gas storage.

In an embodiment, a gas is received through an inlet. A first portion of the gas is supplied to an e-chuck. A second portion of the gas is re-circulated through a compressor. The gas is helium, argon, neon, krypton, xenon, other inert gas, nitrogen, or any combination thereof.

In an embodiment, a gas is received through an inlet. A first portion of the gas is supplied to an e-chuck. A second portion of the gas is supplied to through an orifice to a vacuum line for a first time interval. The second portion of the gas is supplied to a re-circulating line to send through a compressor for a second time interval.

In an embodiment, a gas is received through an inlet. A first portion of the gas is supplied to an e-chuck. A pressure set point for the first portion of the gas is determined. A calibration curve is obtained. A flow rate of the first portion of the gas supplied for pressure set point to the e-chuck is calculated based on the difference between the total flow and the flow at that pressure from calibration curve. The first portion of the gas supplied to the e-chuck is controlled based on the gas pressure and seal between outer seal band of ESC and wafer back surface. A second portion of the gas is re-circulated through a compressor.

In an embodiment, a gas is received through an inlet with first portion of the flow closed. A flow of the gas at a plurality of pressure values while flowing through only second portion is measured to generate a calibration curve. A first portion of the gas is supplied to an e-chuck at a flow rate estimated using the calibration curve. A second portion of the gas is re-circulated through a compressor.

In an embodiment, a gas is received through an inlet. A first portion of the gas is supplied to an e-chuck. It is determined if the gas is supplied through the inlet. A trigger signal is sent to a compressor, if the gas is supplied to the inlet. A second portion of the gas is re-circulated through the compressor.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet. A compressor is coupled to the second outlet to increase a pressure of the second portion of the gas. A gas storage is coupled to the compressor to store the second portion of the gas.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet. The gas is helium, argon, neon, krypton, xenon, other inert gas, nitrogen, or any combination thereof.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet. The controller has a first configuration to control supplying the second portion of the gas through an orifice to a vacuum line for a first time interval, to calculate flow in the first outlet. The controller has a second configuration to control re-circulating the second portion of the gas for a second time interval.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet. The controller has a third configuration to determine a pressure set point for the first portion of the gas. The controller has a fourth configuration to obtain a calibration curve for the gas. The controller has a fifth configuration to estimate a flow rate of the first portion of the gas supplied to the e-chuck based on the calibration curve for the pressure set point. The controller has a sixth configuration to control the first portion of the gas based on the estimated flow rate.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet. The controller has a seventh configuration to control measuring a flow of the gas at a plurality of pressure values to generate a calibration curve. The first portion of the gas is supplied to the e-chuck using the calibration curve.

In an embodiment, a system to increase the efficiency of a gas for an e-chuck comprises an inlet to receive the gas. A first outlet is coupled to the inlet to supply a first portion of the gas to the e-chuck. A second outlet is coupled to the first outlet to re-circulate a second portion of the gas through a compressor. A controller is coupled to control at least one of the inlet, the first outlet, and the second outlet. The controller has an eighth configuration to control determining if the gas is supplied through the inlet. The controller has a ninth configuration to control sending a trigger signal to the compressor, if the gas is supplied to the inlet.

In an embodiment, a non-transitory machine readable medium comprises executable program instructions that when executed by a data processing system, cause the data processing system to perform operations comprising receiving a gas through an inlet; supplying a first portion of the gas to the e-chuck; and re-circulating a second portion of the gas through a compressor.

In an embodiment, a non-transitory machine readable medium comprises executable program instructions that when executed by a data processing system, cause the data processing system to perform operations comprising receiving the gas through an inlet; supplying a first portion of the gas to the e-chuck; re-circulating a second portion of the gas through a compressor; increasing a pressure of the second portion of the gas by the compressor; and storing the second portion of the gas in a gas storage.

In an embodiment, a non-transitory machine readable medium comprises executable program instructions that when executed by a data processing system, cause the data processing system to perform operations comprising receiving a gas through an inlet; supplying a first portion of the gas to the e-chuck; supplying a second portion of the gas through an orifice to a vacuum line for a first time interval, and re-circulating the second portion of the gas through a compressor for a second time interval.

In an embodiment, a non-transitory machine readable medium comprises executable program instructions that when executed by a data processing system, cause the data processing system to perform operations comprising receiving the gas through an inlet; supplying a first portion of the gas to the e-chuck; determining a pressure set point for the first portion of the gas; obtaining a calibration curve for the gas; estimating a flow rate of the first portion of the gas at the e-chuck for the pressure set point based on the calibration curve; controlling the first portion of the gas based on the estimated flow rate; and re-circulating a second portion of the gas through a compressor.

In an embodiment, a non-transitory machine readable medium comprises executable program instructions that when executed by a data processing system, cause the data processing system to perform operations comprising receiving the gas through an inlet; measuring a flow of the gas at a plurality of pressure values to generate a calibration curve; supplying a first portion of the gas to the e-chuck at a flow rate determined using the calibration curve; and re-circulating a second portion of the gas through a compressor.

In an embodiment, a non-transitory machine readable medium comprises executable program instructions that when executed by a data processing system, cause the data processing system to perform operations comprising receiving a gas through an inlet; supplying a first portion of the gas to the e-chuck; determining if the gas is supplied through the inlet; sending a trigger signal to the compressor, if the gas is supplied to the inlet; and re-circulating a second portion of the gas through the compressor.

Other features of the embodiments of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Figure 1:
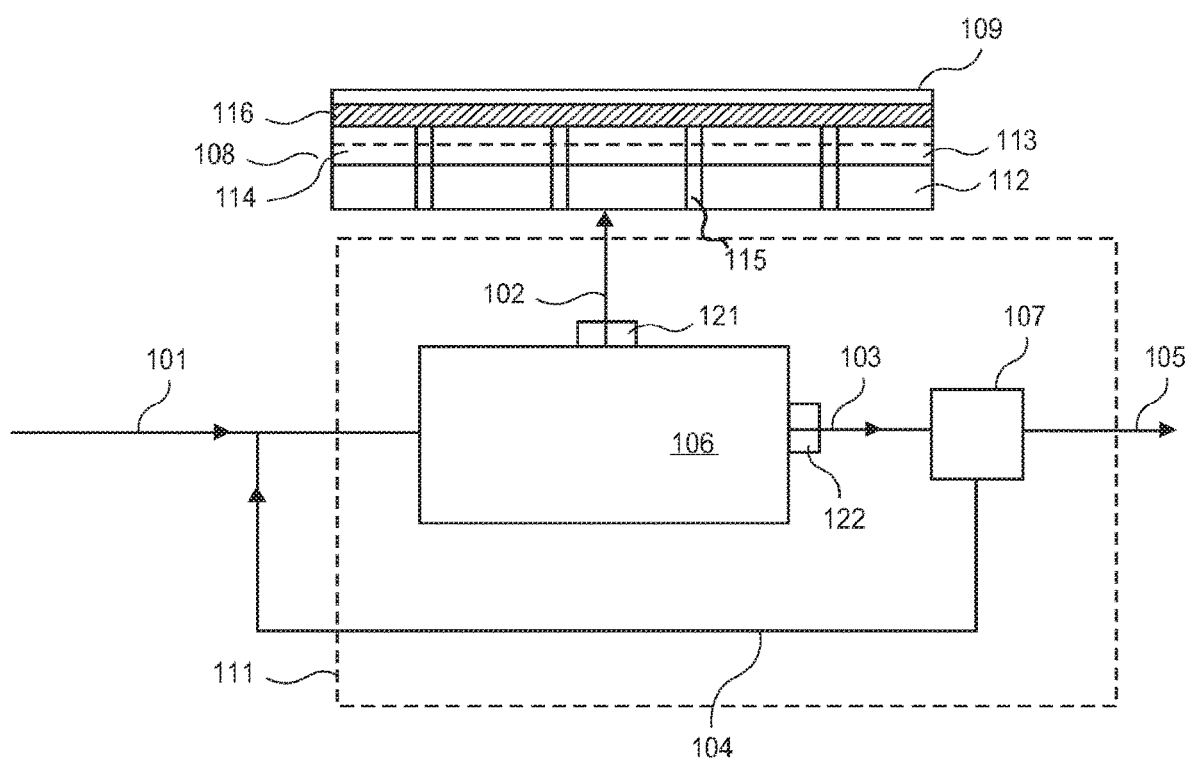
FIG. 1 shows an apparatus to increase the efficiency of a gas usage for an electrostatic chuck according to one embodiment of the invention.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to increase the efficiency of a gas usage in electrostatic chucks (e-chucks) are described. A gas is received through an inlet. A portion of the gas is supplied to an e-chuck. A remaining portion of the gas instead of being dumped into a vacuum line is re-circulated back through an orifice to a compressor to at least one of the inlet and a gas storage.

Supplying a first portion of the gas to an e-chuck and re-circulating a second portion of the gas through a compressor back to the inlet provides an advantage by increasing the efficiency of the back side gas usage for e-chucks by at least about 40 times. More than about 95 percent (%) of the BSG is re-circulated back to the inlet and is not being dumped through an orifice in a vacuum system all the time. The back side gas usage is decreased to a negligible amount so that helium gas can be advantageously used while saving the manufacturing cost.

Furthermore, the methods and apparatuses to increase the efficiency of a gas usage in e-chucks as described herein advantageously can use the existing plasma processing hardware.

FIG. 1 shows an apparatus 100 to increase the efficiency of a gas usage for an electrostatic chuck according to one embodiment of the invention. A gas supply system 111 comprises a servo device 106 having at least two outlets.

In alternative embodiments, the servo device 106 is an automatic device that uses a pressure sensing negative feedback, a flow rate sensing negative feedback, or both to adjust the gas flow to a predetermined set point. An outlet 121 is coupled to e-chuck 108, and an outlet 122 is coupled to a control valve 107. A gas 101 is passed through an inlet of the gas supply system 111 to pressure servo device 106. Gas 101 is a heat transfer gas, or any other gas supplied to the e-chuck. In an embodiment, gas 101 is helium, argon, neon, krypton, xenon, other inert gas, nitrogen, or any combination thereof. A portion 102 of the gas 101 is supplied through outlet 121 of gas servo device 106 to an electrostatic chuck (e-chuck) 108. In an embodiment, the pressure of the portion 102 is adjusted to match a pressure set point at the e-chuck 108. In an embodiment, the pressure set point at the e-chuck 108 is from about 6 torr to about 30 torr. A portion 103 of the gas 101 supplied through outlet 122 to a control valve 107 is re-circulated through a re-circulating line 104 back to the inlet of the gas supply system 111, as shown in FIG. 1.

In an embodiment, the pressure of the re-circulated portion 103 of the gas 101 is increased by a compressor (not shown). In an embodiment, the pressure of the re-circulated portion 103 of the gas is increased so that the portion 102 has the pressure that matches the pressure at the inlet. In one embodiment, the pressure at the inlet is from about 10 psi to about 25 psi. In more specific embodiment, the pressure at the inlet is about 15 psi. In an embodiment, the re-circulated portion 103 of the gas 101 after being compressed by the compressor is stored in a gas storage (not shown) for future use.

In an embodiment, control valve 107 is opened to direct the portion 103 of the gas 101 through an orifice for dumping using a vacuum pump line 105 for a first time interval. Leak rate in first portion is calculated in that interval. In an embodiment, control valve 107 is closed to direct the portion 103 of the gas 101 to the re-circulating line 104 for a second time interval that is greater than the first time interval to restrict loss of the gas in the vacuum pump line 105. In one embodiment, the frequency of the dump is regulated, so that most of the gas is fed back to the re-circulating line.

E-chuck 108 comprises an insulating portion 113 on a conductive base 112. An electrode 114 is embedded into insulating portion 113 to create an attractive force to clamp a wafer 109. In an embodiment, insulating portion 113 is a ceramic, polyimide, or any other dielectric material known to one of ordinary skill in the art of electronic device manufacturing. In one embodiment, conductive base 112 is aluminum, other durable metal, other conductive material, or any combination thereof known to one of ordinary skill in the art of electronic device manufacturing.

Although FIG. 1 depicts one electrode 114, a pair of coplanar electrodes can be imbedded within insulating portion 113 for a bipolar e-chuck. The insulating portion 113 has a top surface for supporting a workpiece 109. With the chucking voltages applied, the workpiece 109 is drawn toward the top surface of the chuck 108 and electrostatically clamped thereto.

In an embodiment, workpiece 109 is a semiconductor wafer, e.g., silicon, germanium, or any other semiconductor wafer. In at least some embodiments, workpiece 109 comprises any material to make any of integrated circuits, passive (e.g., capacitors, inductors) and active (e.g., transistors, photo detectors, lasers, diodes) microelectronic devices. Workpiece 109 may include insulating (e.g., dielectric) materials that separate such active and passive microelectronic devices from a conducting layer or layers that are formed on top of them. In one embodiment, workpiece 109 is a silicon ("Si") substrate that includes one or more dielectric layers e.g., silicon dioxide, silicon nitride, sapphire, and other dielectric materials. In one embodiment, workpiece 109 is a wafer stack including one or more layers. The one or more layers of the workpiece 109 can include conducting, semiconducting, insulating, or any combination thereof layers.

At least one cooling channel, such as a cooling channel 115 is formed through e-chuck 108 to supply a portion 102 of the gas 101 from gas supply system 111 to an interstitial space 116 between the backside of the workpiece 109 and the top surface of the chuck 108. In an embodiment, to ensure uniform distribution of the gas across the backside of the workpiece 109, the top surface of the electrostatic chuck 108 is provided with gas distribution grooves (not shown). Those skilled in the art will realize that any pattern and arrangement of gas distribution grooves (as well as the use of no grooves at all) is within the scope of the embodiments of the invention. In an embodiment, the pressure of the back side gas to provide an adequate heat transfer at e-chunk 108 is from about 6 torr to about 30 torr, and in more specific embodiment, is about 12 torr.

Figure 2:
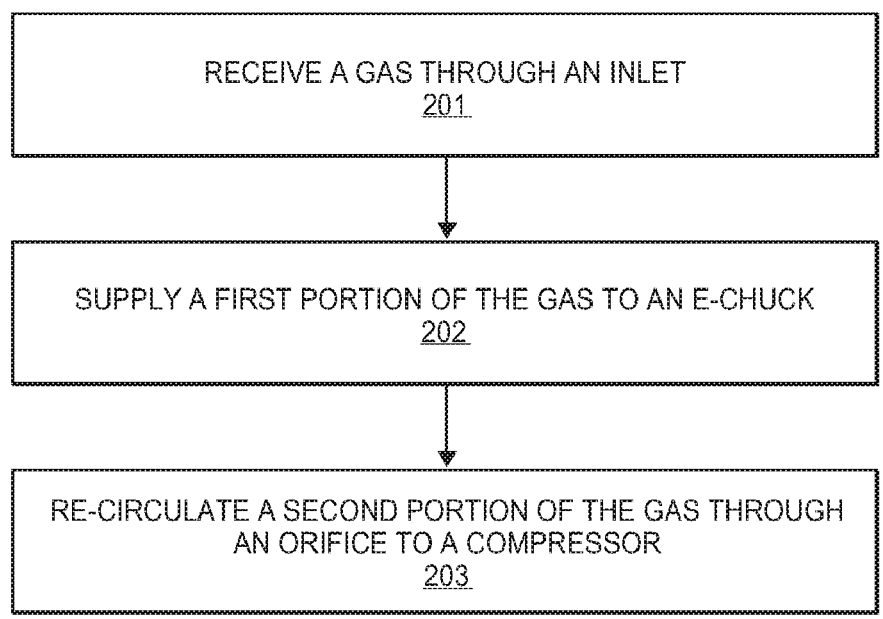
FIG. 2 is a flowchart of a method to increase the gas usage efficiency for an e-chuck according to one embodiment of the invention.

FIG. 2 is a flowchart of a method 200 to increase the gas usage efficiency for an e-chuck according to one embodiment of the invention. At operation 201 a heat transfer gas is received through an inlet. At operation 202 a first portion of the gas is supplied to an e-chuck. At operation 203 a second portion of the gas is re-circulated through an orifice to a compressor to at least one of the inlet and a gas storage, as described above with respect to FIG. 1.

Figure 3A:
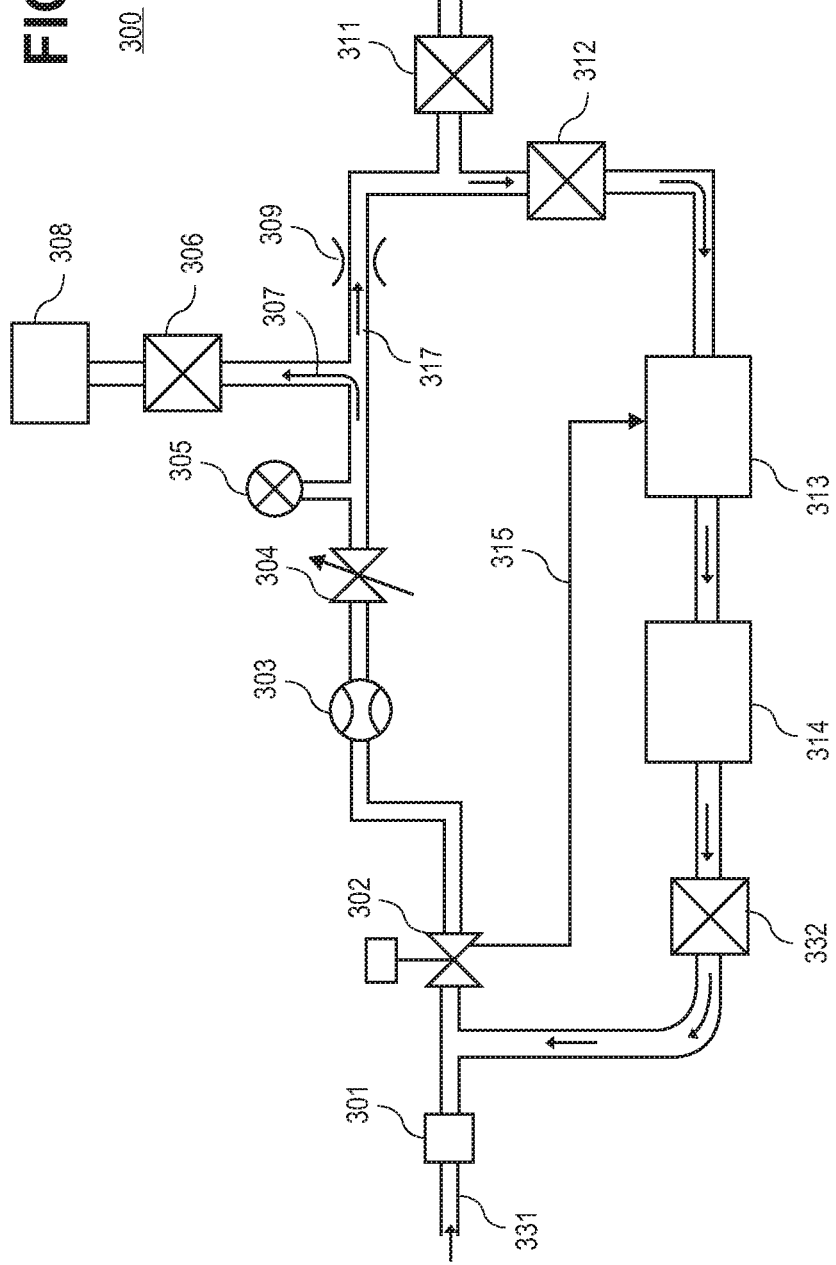
FIG. 3A is a view illustrating an apparatus to increase the efficiency of a gas for an electrostatic chuck according to one embodiment of the invention.

FIG. 3A is a view illustrating an apparatus 300 to increase the efficiency of a gas for an electrostatic chuck according to one embodiment of the invention. Apparatus 300 comprises an inlet 301 and an inlet valve 302 to receive a pressured gas 331. Pressured gas 331 represents e.g., helium, argon, neon, krypton, xenon, other inert gas, nitrogen, or any combination thereof. Inlet valve 302 is opened and a flow of the gas 331 is then passed to a flow control section comprising a flow meter 303, a control valve 304 and a pressure sensor 305. In an embodiment, valve 302 is a pneumatic shut-off valve. In one embodiment, pressure sensor 305 is a Baratron Manometer, or any other gas pressure measurement device known to one of ordinary skill in the art of electronic device manufacturing.

In the flow control section, pressure sensor 305 measures an actual pressure of the gas flow 331. The measured pressure is compared to a predetermined pressure set point, and if the measured pressure does not match to the predetermined pressure set point, an opening of the control valve 304 is adjusted to match the actual pressure to the pressure set point. Control valve 304 can be a solenoid control valve, or any other control valve to adjust the pressure of the gas known to one of ordinary skill in the art. The flow of the gas 331 is monitored by flow meter 303. The flow meter 303 can be a mass flow meter—e.g., MKS Mass-Flo® meter, or any other flow meter to measure a gas flow known to one of ordinary skill in the art. The flow meter 303 is calibrated for a particular gas used for backside wafer cooling. In an embodiment, flow meter 303 is a mass flow controller to measure and control the flow rate of gas 331 to a given flow rate set point. Downstream of the flow control section, a portion 307 of gas 331 is directed through a valve assembly 306 to the electrostatic chuck 308. In an embodiment, a portion 317 of the gas 331 is passed through an orifice 309 and is fed through a re-circulating line back to inlet valve 302. In another embodiment, orifice 309 is positioned between a vacuum valve 311 and a vacuum pump 316, so that there is no orifice before the re-circulating line. In this embodiment, portion 317 of the gas 331 is fed directly through the re-circulating line back to inlet valve 302. In an embodiment, valve assembly 306 comprises a control valve.

Generally, the control valve is used to control gas parameters e.g., flow, pressure by opening or closing in response to a signal received from a controller that compares a set point to an actual parameter value provided by a sensor that monitors changes in such parameters. The opening or closing of the control valve is typically done automatically by an electrical, hydraulic or pneumatic actuator based on electric, or pneumatic signals. In an embodiment, valve assembly 306 comprises a mass flow controller coupled to the control valve to measure and control the flow rate of the portion 307 of the gas 331 to a predetermined flow rate set point. In an embodiment, the predetermined flow rate set point for the portion 307 is in an approximate range from about 0.2 SCCM to about 2 SCCM, and in more specific embodiment is about 0.5 SCCM.

In another embodiment, valve assembly 306 comprises a pressure controller coupled to the control valve. The pressure controller is positioned to regulate the pressure of the gas portion 307 entering the e-chuck 308. When the actual pressure reading is less than the set point value, the pressure controller opens the control valve to increase the amount of gas entering the e-chuck. As the valve opens, the gas portion 307 enters the e-chuck, so the pressure rises to meet the set point value. When the actual pressure reading is greater than the set point value, the pressure controller closes the valve to decrease the amount of the gas portion 307 entering the e-chuck 308. As the valve closes, less gas enters the e-chuck 308, so the pressure drops to meet the set point value.

The re-circulating line comprises control valve 312. Control valve 312 opens to direct the portion 317 to a compressor 313. The pressure of the portion 317 of the gas 331 is increased by the compressor, as described above. In an embodiment, a trigger signal 315 is sent to turn on the compressor. The trigger signal is sent to compressor to indicate that there is the gas in the re-circulating line. The pressed portion 317 of the gas 331 is stored in a gas storage 314. The gas is supplied from gas storage 314 through a valve 332 back to inlet valve 302. In an embodiment, portion 317 of the gas 331 is directed through orifice 309 to a vacuum line connected to vacuum pump 316. In an embodiment, the vacuum line comprises a control valve that opens to supply the portion 317 of the gas to the vacuum pump 316, so that a controlled "bleed" of the gas portion 317 to vacuum through the orifice 309 is provided. In an embodiment, the orifice 309 is a fixed orifice. In another embodiment, the orifice 309 is an adjustable orifice.

Generally, the purpose of the bleed is to insure that the pressure control system is not "dead-ended". Because leak past the wafer is typically very low, the controlled bleed provides an additional pressure relief for faster response to a pressure set point. The size of the orifice 309 depends on the range of the gas flow being measured by flow meter 303. Typically, the greater the gas flow being measured by the flow meter, the greater the size of the orifice.

In one embodiment, the portion 317 of the gas 331 is fed through an orifice to dump on a vacuum line for a first time interval, and is fed to the re-circulating line back to the inlet for a second time interval. In an embodiment, to restrict loss of gas, the dump line is opened during the time intervals that are smaller than the time intervals during which the re-circulating line is opened. In an embodiment, an electric signal is send to close valve 311 and open valve 312 to feed the gas through the re-circulating line back to the inlet. In an embodiment, an electric signal is send to close valve 312 and open valve 311 to feed the gas through the dump vacuum line.

Figure 3B:
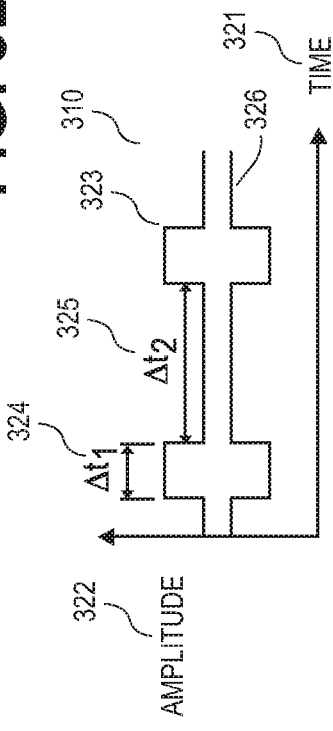
FIG. 3B shows an exemplary graph illustrating electrical signals provided to periodically open and close the valves according to one embodiment of the invention.

FIG. 3B shows an exemplary graph 310 illustrating electrical signals provided to periodically open and close the valves 311 and 312 according to one embodiment of the invention. Graph 310 is a graph representing an amplitude 322 of an electrical signal versus a time 321. For example, a curve 323 represents a signal to open valve 311 during a time interval 324 and to close valve 311 during a time interval 325. For example, a curve 326 represents a signal to close valve 312 during a time interval 324 and to open valve 312 during a time interval 325. In an embodiment, the time interval 325 is greater than time interval 324. In another embodiment, the time interval 325 is smaller than time interval 324. In another embodiment, the time interval 325 is similar to the time interval 324. In an embodiment, the time interval 324 during which the vacuum line is opened to dump the gas is not greater than about 3 seconds. In an embodiment, the time interval 325 during which the re-circulating line is opened is greater than about 3 seconds. In more specific embodiment, the time interval 325 is about 60 seconds.

Figure 4A:
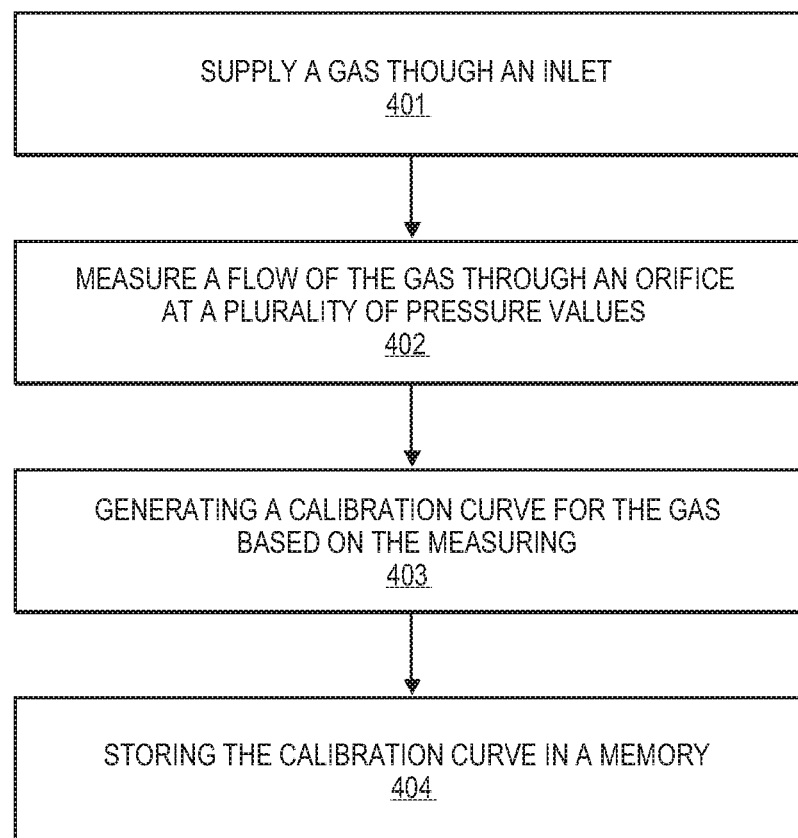
FIG. 4A is a flow chart of a method to generate a calibration curve for a back side gas at an electrostatic chuck according to one embodiment of the invention.

FIG. 4A is a flow chart of a method 400 to generate a calibration curve for a back side gas at an electrostatic chuck according to one embodiment of the invention. At operation 401 a gas is supplied through an inlet. The gas is one of the gases described above. At operation 402 a flow rate of the gas through an orifice is measured at a plurality of pressure values when the gas is directed through a fixed orifice to a vacuum line. In an embodiment, the flow rate of the gas is measured using a flow meter, such as flow meter 303 depicted in FIG. 3. The pressure values for the gas entering the e-chuck are measured using a pressure sensor, such as pressure sensor 305. The flow rate of the portion of the gas passing through an orifice to the vacuum line is determined by the orifice size. In this embodiment, the flow rate of the portion of the gas at the e-chuck (leak rate) is calculated as a difference between the measured flow rate and the flow rate of the gas passing though the orifice to the vacuum line. In another embodiment, the leak rate is measured at a plurality of pressure values mined using a valve assembly, such as valve assembly 306. At operation 403 a calibration curve showing the leak rate as a function of the pressure values is generated. At operation 404 the calibration curve is stored in a memory of a data processing system.

Figure 4B:
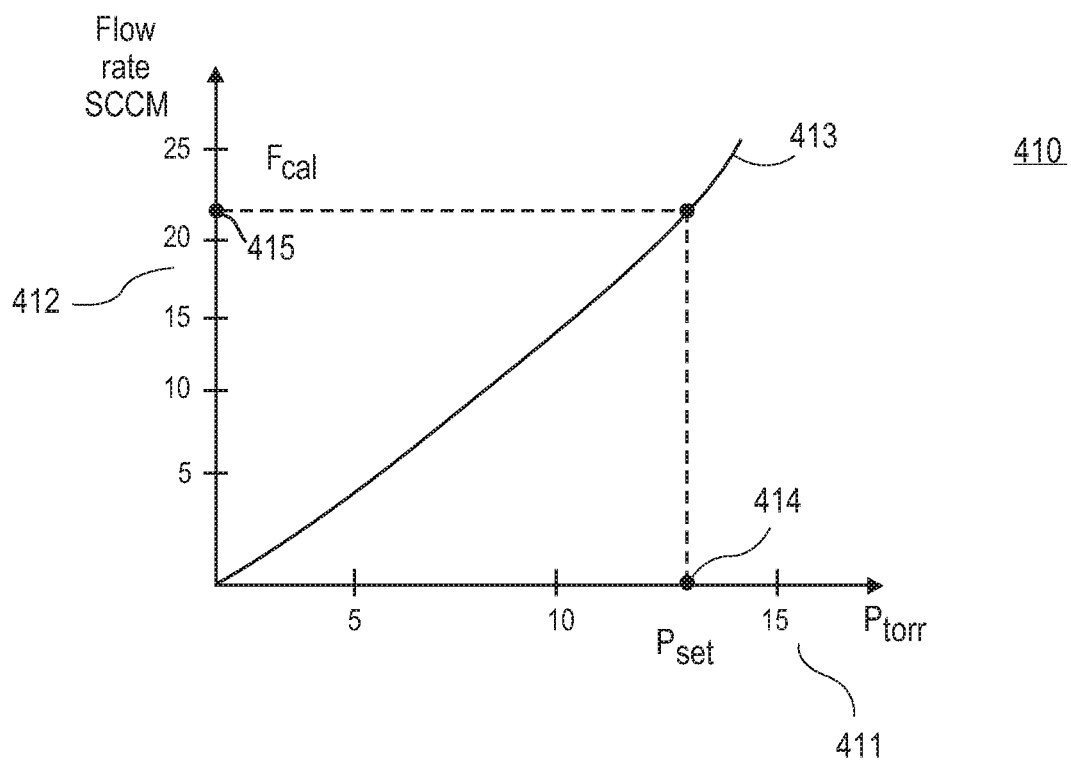
FIG. 4B shows a graph depicting a leak rate versus a gas pressure.

FIG. 4B shows a graph 410 depicting a leak rate 412 versus a gas pressure 411. A calibration curve 413 for the gas is generated by measuring the flow rate at a plurality of pressure values, as described above with respect to FIG. 4A. A leak rate value for a predetermined pressure set point is estimated using the calibration curve. As shown in FIG. 4B, according to curve 413, the leak rate value for a pressure set point 414 is a value 415.

Figure 5:
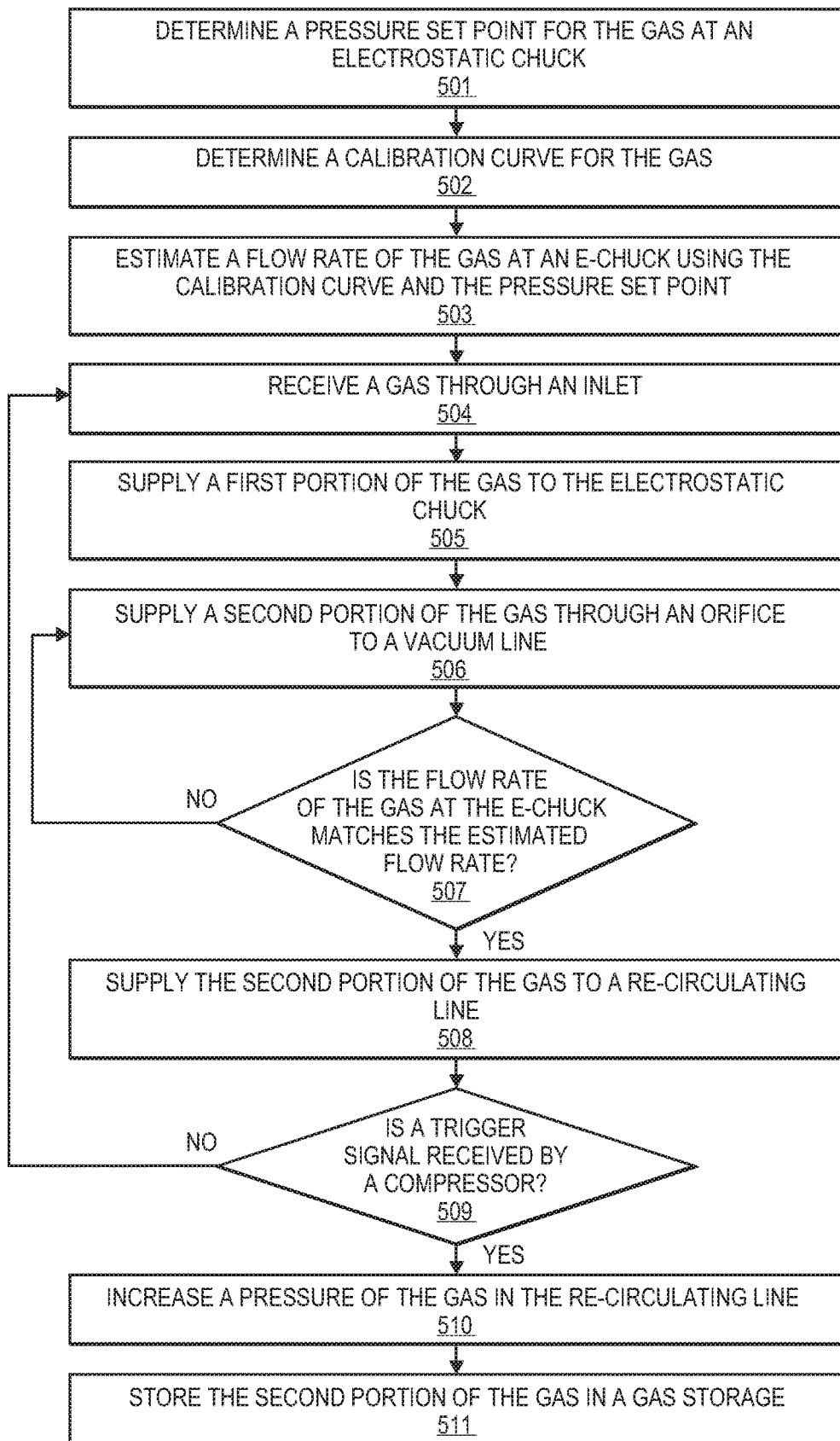
FIG. 5 is a flow chart of a method to increase the efficiency of a gas for an electrostatic chuck according to one embodiment of the invention.

FIG. 5 is a flow chart of a method 500 to increase the efficiency of a gas for an electrostatic chuck according to one embodiment of the invention. At operation 501 a pressure set point for the gas at an electrostatic chuck is determined. The pressure set point is the back side gas pressure at which a desired heat transfer is achieved at the e-chuck. The pressure set point for the gas at the e-chuck can be determined, for example, from a plasma process recipe stored in a memory of a data processing system. At operation 502 a calibration curve for the gas is determined. In one embodiment, the calibration curve for the gas is retrieved from the memory of the data processing system. At operation 503 a flow rate of the gas at an e-chuck (leak rate) is estimated using the calibration curve and the pressure set point, as described above. At operation 504 a gas is received through an inlet, as described above. At operation 505 a first portion of the gas is supplied to the e-chuck, as described above. At operation 506 a second portion of the gas is supplied through an orifice to a vacuum line, as described above. At operation 507 it is determined if the flow rate of the gas at the e-chuck (leak rate) matches the estimated flow rate. The leak rate can be measured using a valve assembly, such as valve assembly 306 depicted in FIG. 3. If the measured leak rate does not match the estimated leak rate, method 500 returns to operation 506. If the measured leak rate matches the estimated leak rate, so that the leak rate is stabilized, at an operation 508 the second portion of the gas is supplied to a re-circulating line, as described above. At an operation 509 it is determined if a trigger signal is received by a compressor. The trigger signal is sent to the compressor to indicate that there is the gas in the re-circulating line. If the trigger signal is received by the compressor, at an operation 510 the compressor turns on to increase the pressure of the gas in the re-circulating line, as described above. If the trigger signal is not received by the compressor, the method 500 returns to operation 504. At operation 511 the compressed second gas portion is stored in a gas storage, as described above.

Figure 6:
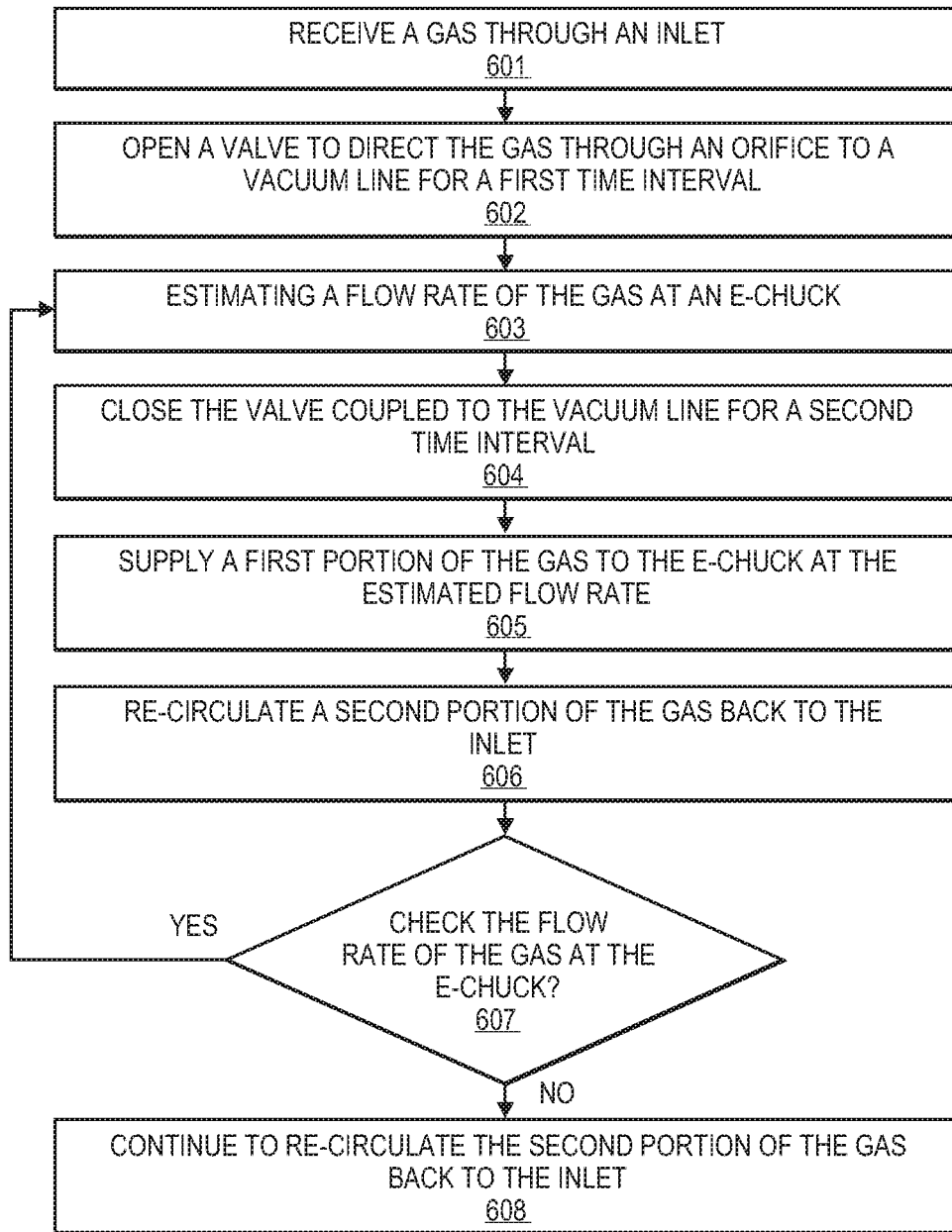
FIG. 6 is a flow chart of a method to increase the efficiency of a gas for an electrostatic chuck according to one embodiment of the invention.

FIG. 6 is a flow chart of a method 600 to increase the efficiency of a gas for an electrostatic chuck according to one embodiment of the invention. At operation 601 a gas is received through an inlet, as described above. At operation 602 a valve to direct the gas through an orifice to a vacuum line, such as valve 311 is opened for a first time interval, as described above. At operation 603 a flow rate of the gas at the e-chuck (leak rate) is estimated. The leak rate can be estimated by measuring the gas flow at a plurality of pressure values to obtain a calibration curve, as described above with respect to FIGS. 4A and 4B. At operation 604 the valve to the vacuum line is closed for a second time interval, as described above. At operation 605 a first portion of the gas is supplied to the e-chuck at the estimated leak rate, as described above. At operation 606 a second portion of the gas is re-circulated back to the inlet, as described above. At operation 607 it is determined if the leak rate at the e-chuck needs to be checked. If the leak rate at the e-chuck needs to be checked, method 600 returns to operation 603. If the leak rate at the e-chuck does not need to be checked, method 600 continues at operation 608 that involves re-circulating the second portion of the gas back to the inlet, as described above.

Figure 7:
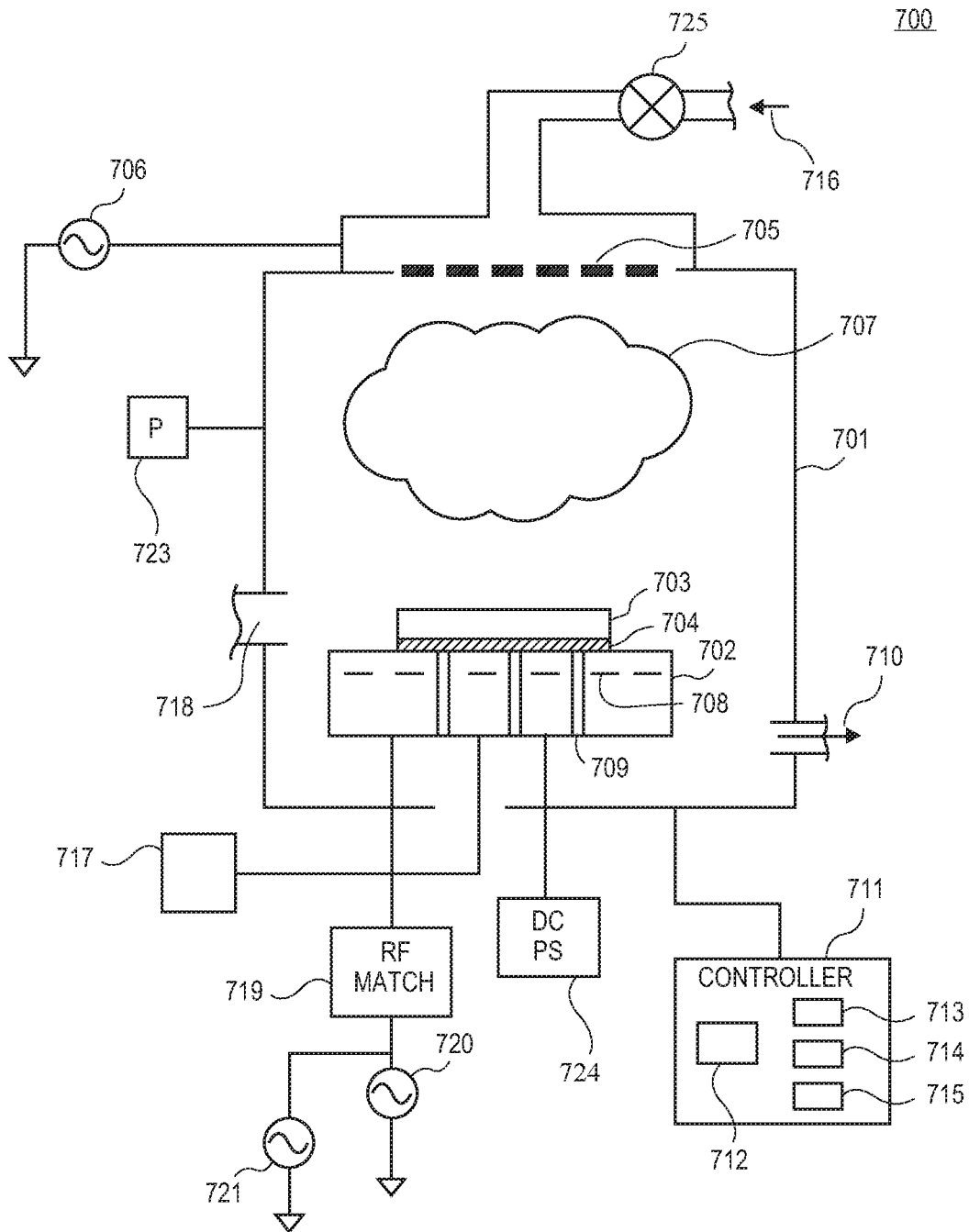
FIG. 7 shows a block diagram of one embodiment of a processing chamber system to perform one or more methods to increase the efficiency of a gas for an electrostatic chuck.

FIG. 7 shows a block diagram of one embodiment of a processing chamber system 700 to perform one or more methods to increase the efficiency of a gas for an electrostatic chuck, as described above. As shown in FIG. 7, system 700 has a processing chamber 701 including a temperature controlled electrostatic chuck pedestal 702. A workpiece 703 is placed on the electrostatic chuck pedestal 702. Workpiece 703 represents one of the workpieces described above. Workpiece 703 is loaded through an opening 718 and clamped to the temperature controlled electrostatic chuck 702. In an embodiment, a gas 704 is passed between the ESC 702 and the workpiece 703. Gas 704 represents one of the gases described above. DC electrode 708 is embedded into the electrostatic chuck 702, as described above. A DC power supply 724 is connected to DC electrode 708. A plurality of cooling channels 709 are formed to supply gas 704 from a gas supplying system 717. Gas supplying system represents one of the systems depicted in FIGS. 1 and 3.

A plasma 707 is produced from one or more process gases 716 using a high frequency electric field. As shown in FIG. 7, a pressure control system 723 provides a pressure to processing chamber 701, a DC bias power supply 724 provides a DC bias voltage to DC electrode 708. As shown in FIG. 7, chamber 701 is coupled to a RF source power 706, and to two RF bias powers 720 and 721 to produce plasma 707. At least one of RF bias powers 720 and 721 is applied to ESC 702 to create directional electric fields near the workpiece. Chamber 701 is evacuated via the exhaust outlet 710. Exhaust outlet 710 is connected to a vacuum pump system (not depicted) to evacuate volatile compounds produced during processing in the chamber. As shown in FIG. 7, process gases 716 are supplied through a mass flow controller 725 to the chamber 701. When a plasma power is applied to the chamber 701, plasma 707 is formed in a processing region over workpiece 703. A plasma bias power 720 is coupled to the chuck 702 via a RF match 719 to energize the plasma. The plasma bias power 720 typically has a frequency between about 2 MHz to 60 MHz. A plasma bias power 721 may also be provided, for example operating at about 2 MHz to 60 MHz to provide a dual frequency bias power. A plasma source power 706 is coupled to a plasma generating element 705 (e.g., showerhead) to provide high frequency source power to energize the plasma. The plasma source power 702 typically has a higher frequency than the plasma bias power 720, and in a particular embodiment, is in the 60 MHz band. In an embodiment, plasma chamber 701 is a capacitively coupled plasma chamber. In another embodiment, plasma chamber 701 is an inductively coupled plasma chamber.

As shown in FIG. 7, system 700 includes a controller 711 coupled to chamber 701 to perform one or more methods, as described herein. The controller 711 comprises a processor 712, a temperature controller 713 coupled to the processor 712, a memory 714 coupled to the processor 712, and an input/output devices 715 coupled to the processor 712. In an embodiment, memory 714 is configured to store calibration curves to determine the leak rate of the gas at the e-chuck, as described above. The controller 711 may be either software or hardware or a combination of both. The processing system 700 may be any type of high performance semiconductor processing chamber known in the art, such as, but not limited to chambers manufactured by Applied Materials. Inc. located in Santa Clara, California. Other commercially available semiconductor chambers may be used to perform the methods as described herein.

Figure 8:
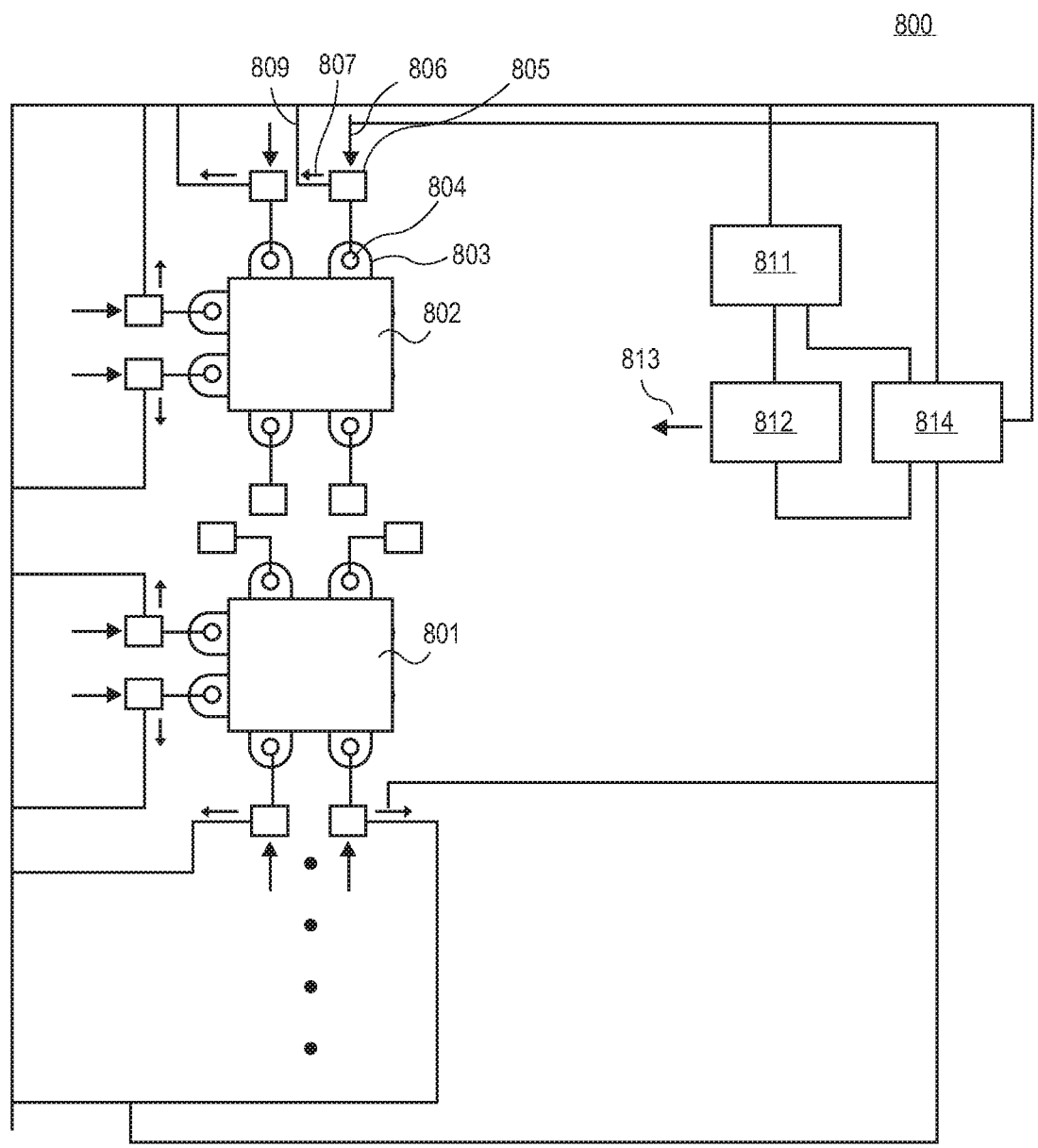
FIG. 8 is a block diagram illustrating an integrated system to increase the efficiency of a gas for an e-chuck according to one embodiment of the invention.

FIG. 8 is a block diagram illustrating an integrated system 800 to increase the efficiency of a gas for an e-chuck according to one embodiment of the invention. The system 800 comprises a plurality of sub-system, such as a sub-system 801 and a sub-system 802. Each of the sub-systems comprises a plurality of processing chambers, such as a chamber 803. Chamber 803 can be a processing chamber as depicted in FIG. 7, or any other processing chamber. Each of the processing chambers comprises an e-chuck, such as an e-chuck 804. E-chuck 804 represents one of the e-chucks as described herein. A gas is supplied to each of the e-chucks by a gas supply system, such as a gas supply system 805. Gas supply system 805 represents gas supply system 111 depicted in FIG. 1, or any other gas supply system to increase the efficiency of a gas usage for an e-chuck as described herein. Each gas supply system has an inlet to receive a gas, such as an inlet 806. Each gas supply system has an outlet to supply a portion of the received gas to the corresponding e-chuck, described herein. Each gas supply system has an outlet to re-circulate 807 a portion of the gas through a re-circulating line, such as a re-circulating line 809 back to the inlet, as described above. A compressor 811 is coupled to each of the re-circulating lines to increase the pressure of the re-circulated portion of the gas, as described herein. A gas storage 812 is coupled to the compressor 811 to store the pressured gas, as described herein. The pressured gas 813 is supplied from the storage back to the inlet of each of the gas supply systems, such as system 805. A controller 814 is coupled to control each of the gas supply inlets, outlets, compressor and gas storage to perform methods described herein.

Figure 9:
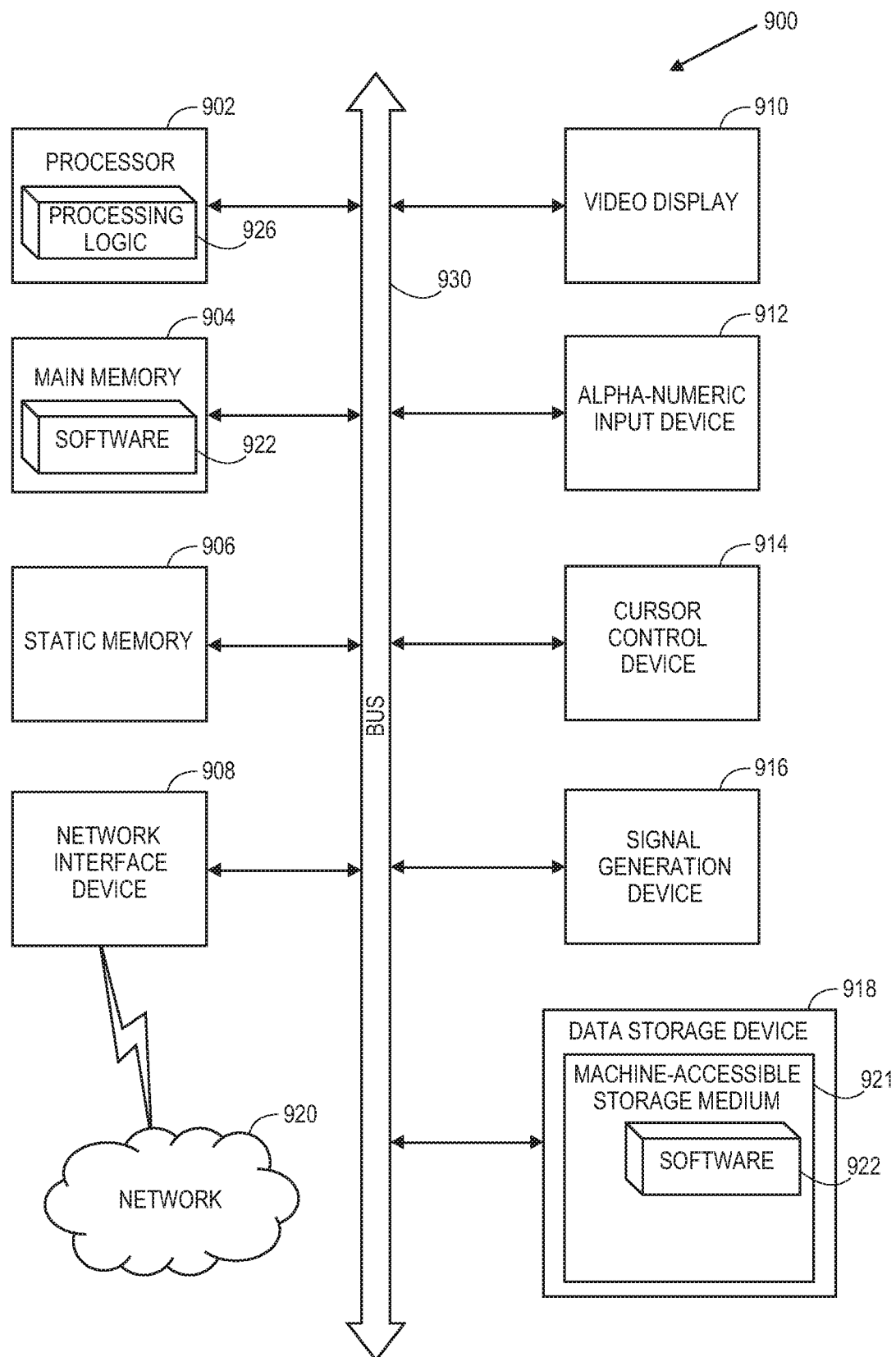
FIG. 9 shows a block diagram of an exemplary embodiment of a data processing system to perform methods described herein.

FIG. 9 shows a block diagram of an exemplary embodiment of a data processing system 900 to perform methods described herein. Data processing system 900 represents controller 711, controller 814 or any other data processing system to control increasing the efficiency of a gas for an electrostatic chuck, as described herein with respect to FIGS. 1-8. In alternative embodiments, the data processing system may be connected (e.g., networked) to other machines in a Local Area Network (LAN), an intranet, an extranet, or the Internet. The data processing system may operate in the capacity of a server or a client machine in a client-server network environment, or as a peer machine in a peer-to-peer (or distributed) network environment.

The data processing system may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be taken to include any collection of data processing systems that individually or jointly execute a set (or multiple sets) of instructions to perform any one or more of the methodologies described herein.

The exemplary data processing system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or other processing device. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to control the processing logic 926 for performing the operations described herein with respect to FIGS. 1-8.

The computer system 900 may further include a network interface device 908. The computer system 900 also may include a video display unit 910, an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 921 on which is stored one or more sets of instructions (e.g., software 922) embodying any one or more of the methodologies or functions described herein. The software 922 may also reside, completely or at least partially, within the main memory 904 and/or within the processor 902 during execution thereof by the data processing system 900, the main memory 904 and the processor 902 also constituting machine-readable storage media. The software 922 may further be transmitted or received over a network 920 via the network interface device 908.

While the machine-accessible storage medium 921 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A non-transitory machine readable medium comprising executable program instructions that, when executed by a data processing system, cause the data processing system to perform operations comprising:
   receiving a gas through an inlet, the gas comprising a first portion and a second portion, and the inlet configured to receive the gas having an initial pressure from about 6 torr to about 30 torr;
   supplying, from a first outlet coupled to the inlet, the first portion of the gas but not the second portion of the gas to the electrostatic chuck;
   opening a control valve for a first time interval for dumping the second portion of the gas through a vacuum pump, the control valve coupled to the first outlet and to a second outlet, and the control valve coupled to a compressor and coupled to the vacuum pump line; and
   closing the control valve for a second time interval to re-circulate the second portion of the gas through the compressor to the inlet prior to entering the electrostatic chuck, the second time interval greater than the first time interval, wherein the first interval time is not greater than about 3 seconds, and the second interval time is about 60 seconds, and the compressor is configured to increase a pressure of the second portion of the gas to match the pressure of the gas received at the inlet, the pressure of the gas received at the inlet from about 10 psi to about 25 psi, wherein a controller is coupled to and configured to control all of the inlet, the first outlet, the control valve, and the second outlet.

2. The non-transitory machine readable medium of claim 1, further comprising instructions that when executed by the data processing system, cause the data processing system to perform operations comprising:
   storing the second portion of the gas in a gas storage coupled to the compressor.

3. The non-transitory machine readable medium of claim 2, wherein the gas is helium, argon, neon, krypton, xenon, other inert gas, nitrogen, or any combination thereof.

4. The non-transitory machine readable medium of claim 2, wherein the controller has a first configuration to control supplying the second portion of the gas through an orifice to the vacuum pump line for the first time interval, and wherein the controller has a second configuration to control the re-circulating the second portion of the gas for the second time interval.

* * * * *